United States Patent
Kim et al.

(10) Patent No.: US 11,392,049 B2
(45) Date of Patent: Jul. 19, 2022

(54) PELLICLE FOR EXTREME ULTRAVIOLET LITHOGRAPHY

(71) Applicant: KOREA ELECTRONICS TECHNOLOGY INSTITUTE, Seongnam-si (KR)

(72) Inventors: Hyeong Keun Kim, Yongin-si (KR); Hyun Mi Kim, Seoul (KR); Jin Woo Cho, Seoul (KR); Seul Gi Kim, Yongin-si (KR); Ki Hun Seong, Anyang-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 0 days.

(21) Appl. No.: 17/454,104

(22) Filed: Nov. 9, 2021

(65) Prior Publication Data

US 2022/0146949 A1    May 12, 2022

(30) Foreign Application Priority Data

Nov. 9, 2020  (KR) .......................... 10-2020-0148420

(51) Int. Cl.
    *G03F 7/20*    (2006.01)
    *G03F 1/62*    (2012.01)
(52) U.S. Cl.
    CPC ............ *G03F 7/70983* (2013.01); *G03F 1/62* (2013.01); *G03F 7/70033* (2013.01)
(58) Field of Classification Search
    CPC ...................................................... G03F 1/62
    See application file for complete search history.

(56) References Cited

U.S. PATENT DOCUMENTS

2017/0205704 A1    7/2017  Nikipelov et al.
2019/0129299 A1*   5/2019  Nasalevich ......... G03F 7/70983

FOREIGN PATENT DOCUMENTS

| JP | 2006/170916 A | 6/2006 |
| JP | 2020-098227 A | 6/2020 |
| KR | 10-2018-0072786 A | 6/2018 |
| KR | 10-18787330 B1 | 7/2018 |
| KR | 10-2018-0135490 A | 12/2018 |
| KR | 10-2019-0053706 A | 5/2019 |
| KR | 10-2020-0112756 A | 10/2020 |
| KR | 10-2020-0126216 A | 11/2020 |
| WO | 2017/102379 A1 | 6/2017 |
| WO | 2017/186486 A1 | 11/2017 |

OTHER PUBLICATIONS

Extended European Search Report in European Application No. 21207122.9 dated Mar. 25, 2022 in 10 pages.

* cited by examiner

*Primary Examiner* — Michelle M Iacoletti
(74) *Attorney, Agent, or Firm* — Knobbe Martens Olson & Bear LLP

(57) ABSTRACT

A pellicle for extreme ultraviolet lithography has an extreme ultraviolet transmittance of 90% or more and also has thermal stability, mechanical stability, and chemical durability. The pellicle includes a support layer and a pellicle layer. The support layer has an opening formed in a central portion thereof. The pellicle layer is formed on the support layer to cover the opening and includes $ZrB_x$ ($2<x<16$).

13 Claims, 13 Drawing Sheets

PELLICLE FOR EXTREME ULTRAVIOLET LITHOGRAPHY

CROSS-REFERENCE TO RELATED APPLICATION

The present application claims priority to Korean Patent Application No. 10-2020-0148420 filed on Nov. 9, 2020 in the Korean Intellectual Property Office, which is incorporated herein in its entirety by reference.

BACKGROUND

Technical Field

The present disclosure relates to a semiconductor lithography apparatus, and more particularly, to a pellicle for extreme ultraviolet lithography installed on a mask used in a semiconductor lithography process based on extreme ultraviolet (EUV).

Description of Related Technology

As the semiconductor industry continues to develop and the degree of semiconductor integration is dramatically improved, electronic devices are becoming smaller and lighter. In order to further improve the degree of semiconductor integration, the advancement of lithography technology is required.

Currently, technology is developing toward realizing a fine pattern of a semiconductor by reducing the wavelength of light. Extreme ultraviolet (EUV) lithography technology, recently developed as a next-generation technology, can realize a fine pattern through a single resist process.

SUMMARY

Accordingly, the present disclosure provides a pellicle for extreme ultraviolet lithography having an extreme ultraviolet transmittance of 90% or more in an extreme ultraviolet output environment of 350 W or more.

In addition, the present disclosure provides a pellicle for extreme ultraviolet lithography having thermal stability, mechanical stability, and chemical durability while having a high extreme ultraviolet transmittance of 90% or more.

According to embodiments of the present disclosure, a pellicle for extreme ultraviolet lithography having an extreme ultraviolet transmittance of 90% or more may include a support layer having an opening formed in a central portion thereof; and a pellicle layer including a core layer formed of $ZrB_x$ ($2<x<16$) on the support layer to cover the opening.

The support layer may be a silicon substrate.

The pellicle layer may include a core layer; and a capping layer formed on both surfaces of the core layer.

The capping layer may include B, C, Zr, $SiO_x$, $SiN_x$, $ZrO_x$, $ZrSi_x$ ($x\le2$), $ZrC_x$ ($0.8\le x\le1.2$), $ZrB_x$ ($2<x<16$), $ZrB_xSi_y$ ($x\ge2$, $y\ge2$), $ZrC_xB_y$ ($0.8\le x\le1.2$, $y\ge2$), or $ZrC_xSi_y$ ($0.8\le x\le1.2$, $y\le2$).

The pellicle layer may have a thickness of 40 nm or less and the capping layer may have a maximum thickness of 10 nm.

The pellicle layer may include the core layer having a first surface and a second surface opposite to the first surface; a first buffer layer formed on the first surface; a second buffer layer formed on the second surface; a first capping layer formed on the first buffer layer; and a second capping layer formed on the second buffer layer.

At least one of the first buffer layer, the second buffer layer, the first capping layer, and the second capping layer may include the $ZrB_x$ ($2<x<16$).

Each of the first and second buffer layers may include B, C, Zr, $ZrSi_x$ ($x\le2$), $ZrC_x$ ($0.8\le x\le1.2$), $ZrB_x$ ($2<x<16$), $ZrB_xSi_y$ ($x\ge2$, $y\ge2$), $ZrC_xB_y$ ($0.8\le x\le1.2$, $y\ge2$), or $ZrC_xSi$ ($0.8\le x\le1.2$, $y\le2$).

Each of the first and second capping layers may include B, C, Zr, $SiO_x$, $SiN_x$, $ZrO_x$, $ZrSi_x$ ($x\le2$), $ZrC_x$ ($0.8\le x\le1.2$), $ZrB_x$ ($2<x<16$), $ZrB_xSi_y$ ($x\ge2$, $y\ge2$), $ZrC_xB_y$ ($0.8\le x\le1.2$, $y\ge2$), or $ZrC_xSi_y$ ($0.8\le x\le1.2$, $y\le2$).

The pellicle layer may have a thickness of 40 nm or less, each of the first and second buffer layers may have a thickness of 3 nm or less, and each of the first and second capping layers may have a thickness of 5 nm or less.

According to embodiments of the present disclosure, a pellicle for extreme ultraviolet lithography having an extreme ultraviolet transmittance of 90% or more may include a support layer having an opening formed in a central portion thereof; and a pellicle layer formed on the support layer to cover the opening, and including $ZrB_x$ ($2<x<16$) or including a ternary system or more material selected from Zr, B, Si, and Mo, wherein the pellicle layer may include a core layer formed of the $ZrB_x$ ($2<x<16$); and a capping layer formed on both surfaces of the core layer.

The capping layer may include the $ZrB_x$ ($2<x<16$) or include the ternary system or more material selected from Zr, B, Si, and Mo.

The pellicle layer may include the core layer having a first surface and a second surface opposite to the first surface; a first buffer layer formed on the first surface; a second buffer layer formed on the second surface; a first capping layer formed on the first buffer layer; and a second capping layer formed on the second buffer layer, and at least one of the first buffer layer, the second buffer layer, the first capping layer, and the second capping layer may include the $ZrB_x$ ($2<x<16$) or include the ternary system or more material selected from Zr, B, Si, and Mo.

According to embodiments of the present disclosure, the pellicle for extreme ultraviolet lithography can provide a high transmittance of 90% or more because at least one of the core layer, the buffer layer, and the capping layer constituting the pellicle layer contains $ZrB_x$ ($2<x<16$).

In addition, the pellicle for extreme ultraviolet lithography according to the present disclosure can provide thermal stability, mechanical stability, and chemical durability while having a high transmittance of 90% or more.

DETAILED DESCRIPTION

An extreme ultraviolet lithography apparatus used in a semiconductor process includes a light source power, a resist, a pellicle, and a mask. The pellicle is installed on the mask to prevent contaminants generated during the lithography process from adhering to the mask, and is selectively used depending on the lithography machine.

In the extreme ultraviolet lithography process, there was an expectation that the pellicle would not be needed because a clean system was built. However, it has been known that during an actual operation after the construction of the lithography apparatus, contamination of the mask is caused by foreign substances generated from an internal driving unit of the apparatus, particles of tin generated in the oscillation of the light source, and extreme ultraviolet photoresist.

Therefore, in the extreme ultraviolet lithography process, the pellicle is recognized as an essential component so as to prevent contamination of the mask. When the pellicle is used, defects smaller than 10,000 nm in size are negligible.

The pellicle for extreme ultraviolet lithography is required to have a size of 110 mm×144 mm to cover the mask, and an extreme ultraviolet transmittance of 90% or more is required in order to minimize deterioration of productivity due to loss of a light source. In addition, mechanical stability that the pellicle is not damaged by physical movement up to 20 G inside the extreme ultraviolet lithography apparatus, and thermal stability that the pellicle can withstand a thermal load of 250 W or more based on a 5 nm node are required. Also, chemical durability that the pellicle does not react to hydrogen radicals generated in an extreme ultraviolet environment is required.

Unfortunately, the pellicle for extreme ultraviolet lithography that has been developed and introduced so far is based on polycrystalline silicon (p-Si) or SiN, but the transmittance is less than 90%.

Hereinafter, an embodiment of the present disclosure will be described in detail with reference to the accompanying drawings. The present disclosure may, however, be embodied in many different forms and should not be construed as being limited to the embodiment set forth herein. Rather, this embodiment is provided so that the disclosure will be thorough and complete and will fully convey the scope of the disclosure to those skilled in the art. Accordingly, an embodiment described herein should be understood to include various modifications, equivalents, and/or alternatives.

In addition, techniques that are well known in the art and not directly related to the present disclosure are not described herein. This is to clearly convey the subject matter of the present disclosure by omitting an unnecessary explanation. Also, the terms are merely used for describing a particular embodiment but do not limit the embodiment. Singular forms are intended to include plural forms unless the context clearly indicates otherwise.

Figure 1:
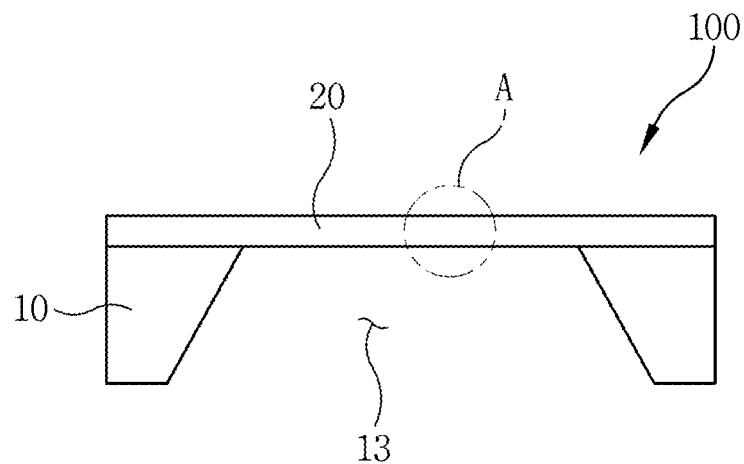
FIG. 1 is a cross-sectional view showing a pellicle for extreme ultraviolet lithography according to the present disclosure.
Figure 2:
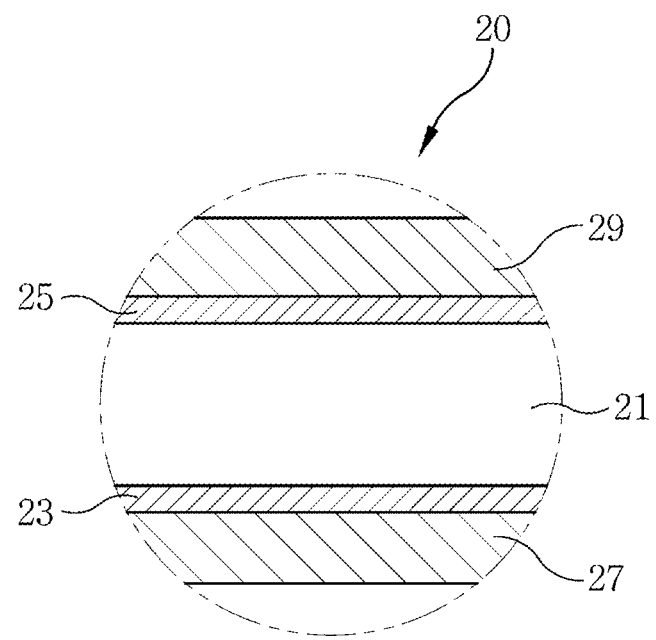
FIG. 2 is an enlarged view showing a portion 'A' of FIG. 1.

FIG. 1 is a cross-sectional view showing a pellicle for extreme ultraviolet lithography according to the present disclosure. FIG. 2 is an enlarged view showing a portion 'A' of FIG. 1.

Referring to FIGS. 1 and 2, a pellicle 100 for extreme ultraviolet lithography according to the present disclosure (hereinafter referred to as 'pellicle') includes a support layer 10 having an opening 13 formed in a central portion thereof, and a pellicle layer 20 formed on the support layer 10 so as to cover the opening 13. The pellicle layer 20 includes $ZrB_x$ (2<x<16) or includes a ternary system or more material selected from Zr, B, Si, and Mo.

The pellicle layer 20, including $ZrB_x$ (2<x<16) or including a ternary system or more material selected from Zr, B, Si, and Mo, not only has a high extreme ultraviolet transmittance of 90% or more, but also provides thermal stability, mechanical stability, and chemical durability.

The pellicle 100 is a consumable component that protects a mask from contaminants in a lithography process for semiconductor or display manufacturing. That is, the pellicle 100 is a thin film overlying the mask and serves as a cover. Because the light transferred to the wafer is focused with the mask in a lithographic exposure, even if contaminants exist on the pellicle 100 that is separated by a certain distance, it is possible to minimize a problem of forming a defective pattern due to out of focus.

As such, the pellicle 100 may minimize defective patterns while protecting the mask from contaminants during the exposure process, thereby greatly increasing the yield of semiconductor or display manufacturing. In addition, the use of the pellicle 100 can increase the lifespan of the mask.

Now, the pellicle 100 according to the present disclosure will be described in detail.

The support layer 10 supports the pellicle layer 20 and makes it easy to handle and transport the pellicle 100 during and after the process of manufacturing the pellicle 100. The support layer 10 may be formed of a material available for an etching process, and this material may be, for example, but is not limited to, silicon, quartz, or silicon-on-insulator (SOI). The opening 13 formed in the central portion of the support layer 10 may be formed using a micro-machining technique such as micro-electro mechanical systems (MEMS).

The pellicle layer 20 includes a core layer 21 and capping layers 27 and 29, and may further include buffer layers 23 and 25 interposed between the core layer 21 and the capping layers 27 and 29.

The core layer 21 is a layer that determines the transmittance of extreme ultraviolet rays. The core layer 21 has a transmittance of 90% or more for extreme ultraviolet rays, and effectively dissipates heat to prevent the pellicle layer 20 from being overheated. The core layer 21 may have a thickness greater than the sum of the thicknesses of the capping layers 27 and 29 and the buffer layers 23 and 25.

In general, considering thermal stability, mechanical stability, and chemical durability, the thicker the core layer 21, the better. However, as the thickness increases, the transmittance of the pellicle layer 20 may decrease. Because the pellicle layer 20 according to the present disclosure includes $ZrB_x$ (2<x<16) or includes a ternary system or more material selected from Zr, B, Si, and Mo, the pellicle layer 20 is capable of providing a transmittance of 90% or more with respect to extreme ultraviolet rays even if the core layer 21 is formed to a thickness of 30 nm.

The capping layers 27 and 29 provide thermal stability, mechanical stability, and chemical durability to the pellicle layer 20 while minimizing a decrease in the transmittance of the core layer 21 for extreme ultraviolet rays. Specifically, the capping layers 27 and 29 are protective layers for the core layer 21 and provide thermal stability by effectively dissipating heat generated in the core layer 21 to the outside. In addition, the capping layers 27 and 29 provide mechanical stability by supplementing the mechanical strength of the core layer 21. In addition, the capping layers 27 and 29 provide chemical durability by protecting the core layer 21 from hydrogen radicals and oxidation.

The buffer layers 23 and 25 relieve thermal stress caused by thermal expansion between the core layer 21 and the capping layers 27 and 29. The buffer layers 23 and 25 may be omitted depending on the materials of the core layer 21 and the capping layers 27 and 29. The buffer layers 23 and 25 may be formed to have a smaller thickness than the capping layers 27 and 29.

The pellicle layer 20 may include the core layer 21 and the capping layers 27 and 29. The core layer 21 has a first surface and a second surface opposite to the first surface. The capping layers 27 and 29 include a first capping layer 27 formed on the first surface of the core layer 21, and a second capping layer 29 formed on the second surface of the core layer 21.

For example, the core layer 21 may include $ZrSi_x$ ($x \le 2$), $ZrC_x$ ($0.8 \le x \le 1.2$), $ZrB_x$ ($2 < x < 16$), MoSiZr, or $ZrB_xSi_y$ ($x \ge 2$, $y \ge 2$).

Each of the first and second capping layers 27 and 29 may include B, C, Zr, $SiO_x$, $SiN_x$, $ZrO_x$, $ZrSi_x$ ($x \le 2$), $ZrC_x$ ($0.8 \le x \le 1.2$), $ZrB_x$ ($2 < x < 16$), $ZrB_xSi_y$ ($x \ge 2$, $y \ge 2$), $ZrC_xB_y$ ($0.8 \le x \le 1.2$, $y \ge 2$), or $ZrC_xSi_y$ ($0.8 \le x \le 1.2$, $y \ge 2$). Among such materials of the first and second capping layers 27 and 29, C may include graphene, SiC, or the like. The first and second capping layers 27 and 29 may be formed in an atomic layer deposition (ALD) or ion beam sputtering deposition (IBSD) process, so that the best transmittance and minimized defects can be realized through free control of thickness, physical properties, and chemical composition.

In case of the pellicle layer 20 composed of the core layer 21 and the capping layers 27 and 29, even if it has a thickness of 40 nm or less and the capping layers 27 and 29 are formed to have a maximum thickness of 10 nm, it has a high extreme ultraviolet transmittance of 90% or more in an extreme ultraviolet output environment of 350 W or more while providing thermal stability, mechanical stability, and chemical durability.

Alternatively, the pellicle layer 20 may include the core layer 21, the buffer layers 23 and 25, and the capping layers 27 and 29. The buffer layers 23 and 25 include a first buffer layer 23 formed on the first surface of the core layer 21, and a second buffer layer 23 formed on the second surface of the core layer 21. The capping layers 27 and 29 include a first capping layer 27 formed on the first buffer layer 23, and a second capping layer 29 formed on the second buffer layer 25.

The core layer 21 may include $ZrSi_x$ ($x \le 2$), $ZrC_x$ ($0.8 \le x \le 1.2$), $ZrB_x$ ($2 < x < 16$), MoSiZr, or $ZrB_xSi_y$ ($x \ge \lambda$, $y \ge 2$).

Each of the first and second buffer layers 23 and 25 may include B, C, Zr, $ZrSi_x$ ($x \le 2$), $ZrC_x$ ($0.8 \le x \le 1.2$), $ZrB_x$ ($2 < x < 16$), $ZrB_xSi_y$ ($x \ge 2$, $y \ge 2$), $ZrC_xB_y$ ($0.8 \le x \le 1.2$, $y \ge 2$), or $ZrC_xSi$ ($0.8 \le x \le 1.2$, $y \ge 2$). Among such materials of the first and second buffer layers 23 and 25, C may include graphene, SiC, or the like.

Each of the first and second capping layers 27 and 29 may include B, C, Zr, $SiO_x$, $SiN_x$, $ZrO_x$, $ZrSi_x$ ($x \le 2$), $ZrC_x$ ($0.8 \le x \le 1.2$), $ZrB_x$ ($2 < x < 16$), $ZrB_xSi_y$ ($x \ge 2$, $y \ge 2$), $ZrC_xB_y$ ($0.8 \le x \le 1.2$, $y \ge 2$), or $ZrC_xSi_y$ ($0.8 \le x \le 1.2$, $y \ge 2$). Among such materials of the first and second capping layers 27 and 29, C may include graphene, SiC, or the like.

Each of the first and second buffer layers 23 and 25 and the first and second capping layers 27 and 29 may be formed in an atomic layer deposition (ALD) or ion beam sputtering deposition (IBSD) process, so that the best transmittance and minimized defects can be realized through free control of thickness, physical properties, and chemical composition.

In case of the pellicle layer 20 composed of the core layer 21, the buffer layers 23 and 25, and the capping layers 27 and 29, even if it has a thickness of 40 nm or less in which each of the buffer layers 23 and 25 has a thickness of 3 nm or less and each of the capping layers 27 and 29 has a thickness of 5 nm or less, it has a high extreme ultraviolet transmittance of 90% or more in an extreme ultraviolet output environment of 350 W or more while providing thermal stability, mechanical stability, and chemical durability.

That is, the capping layer is required in general to be formed to have a thickness of 5 nm or less in order to provide thermal stability and chemical durability while ensuring high transmittance.

However, according to the present disclosure, the pellicle layer 20 that includes $ZrB_x$ ($2 < x < 16$) or includes a ternary system or more material selected from Zr, B, Si, and Mo can have a high extreme ultraviolet transmittance of 90% or more, provide thermal stability, mechanical stability, and chemical durability, and allow the capping layers 27 and 29 to have a thickness up to 10 nm.

The pellicle 100 according to the present disclosure may be manufactured by the following manufacturing process. First, the first capping layer 27, the first buffer layer 23, the core layer 21, the second buffer layer 25, and the second capping layer 29 are sequentially stacked on the support layer 10 in which the opening 13 is not yet formed.

Thereafter, through selective etching of the support layer 10, the opening 13 is formed in the central portion of the support layer 10 to expose the first capping layer 27. As a result, the pellicle 100 according to the present disclosure is obtained.

In order to confirm the transmittance and reflectance of the pellicle according to the present disclosure in an extreme ultraviolet output environment of 350 W or more, simulations were performed on the pellicles according to first to third embodiments as illustrated in FIGS. 3A to 14B.

FIGS. 3A to 6B are graphs showing transmittance and reflectance of extreme ultraviolet lithography pellicles including a core layer of $ZrB_x$ (x=12) according to a first embodiment of the present disclosure.

Referring to FIGS. 3A to 6B, the pellicle according to the first embodiment includes a core layer of $ZrB_x$ (x=12), first and second buffer layers of $ZrSi_2$, and first and second capping layers of $Si_3N_4$. While changing the thickness of the core layer to 0 to 30 nm, the thickness of the first and second buffer layers to 0 to 3 nm, and the thickness of the first and second capping layers to 0 to 20 nm, respectively, transmittance and reflectance in an extreme ultraviolet output environment of 350 W were simulated for the pellicle according to the first embodiment.

Figure 3A:
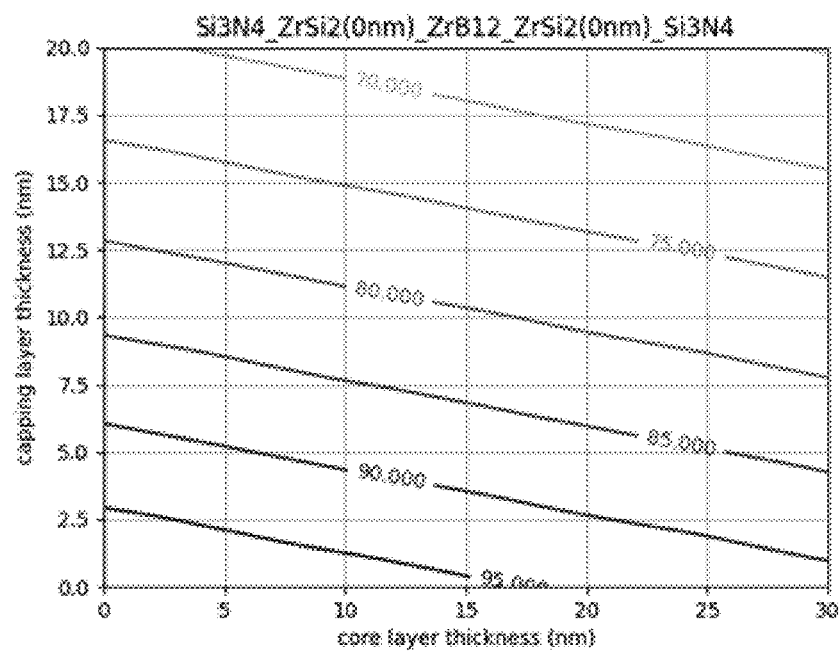
FIGS. 3A, 3B, 4A, 4B, 5A, 5B, 6A, and 6B are graphs showing transmittance and reflectance of extreme ultraviolet lithography pellicles including a core layer of $ZrB_x$ (x=12) according to a first embodiment of the present disclosure.
Figure 3B:
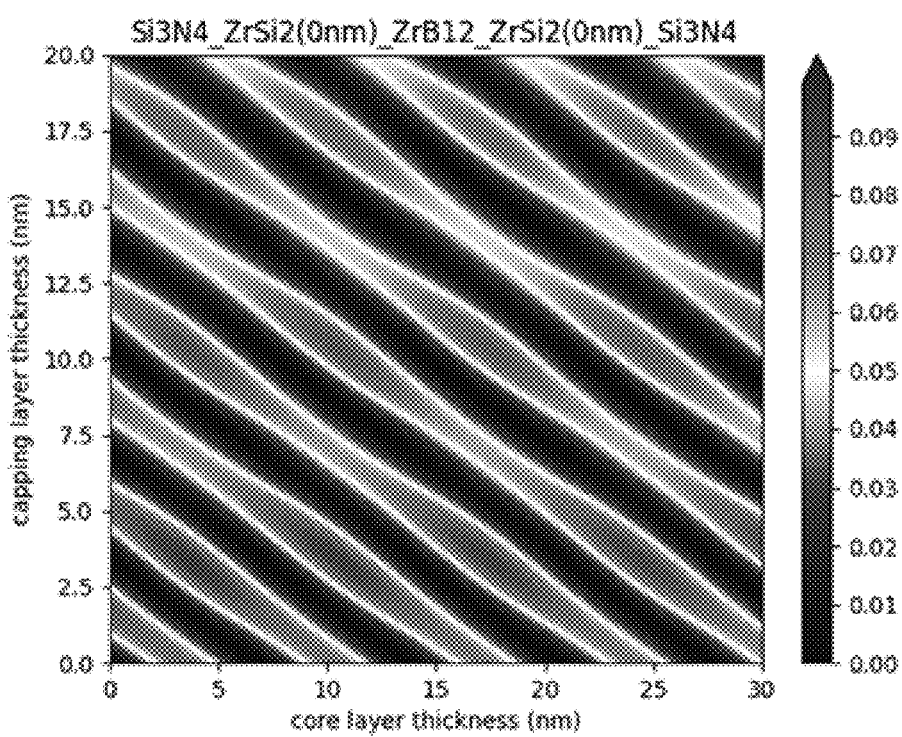
Figure 4A:
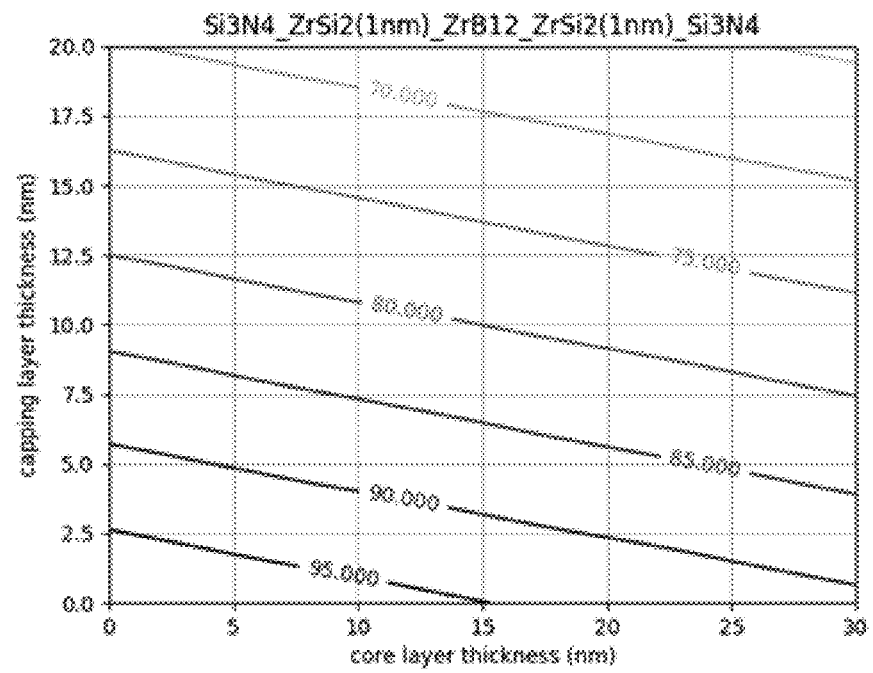
Figure 4B:
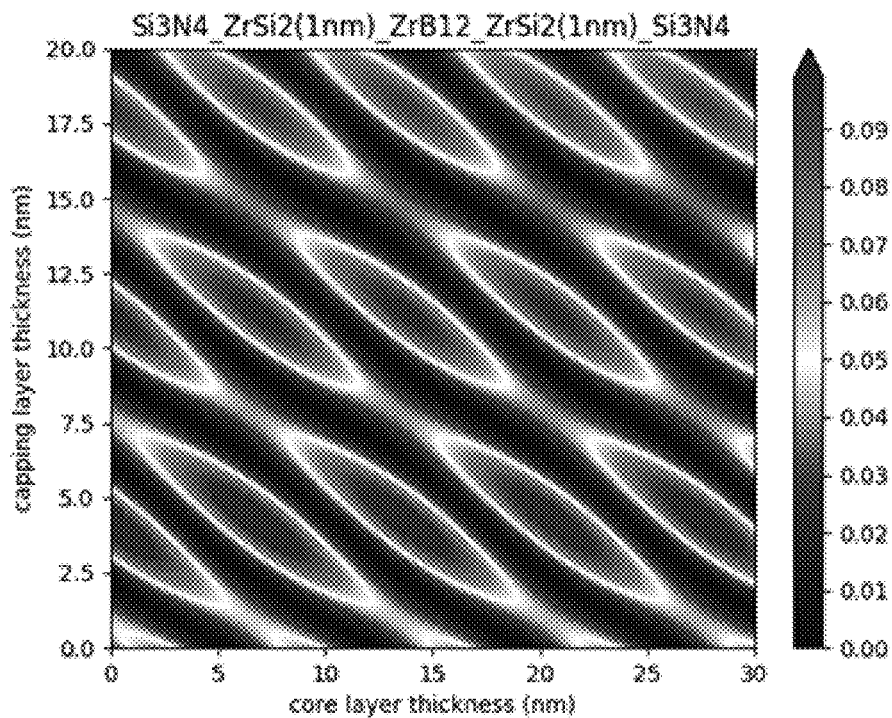
Figure 5A:
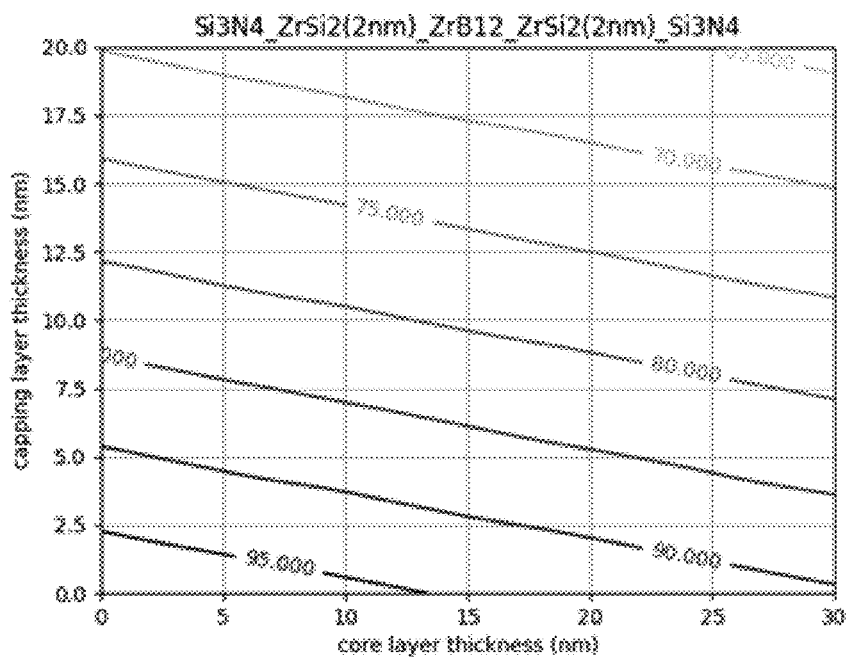
Figure 5B:
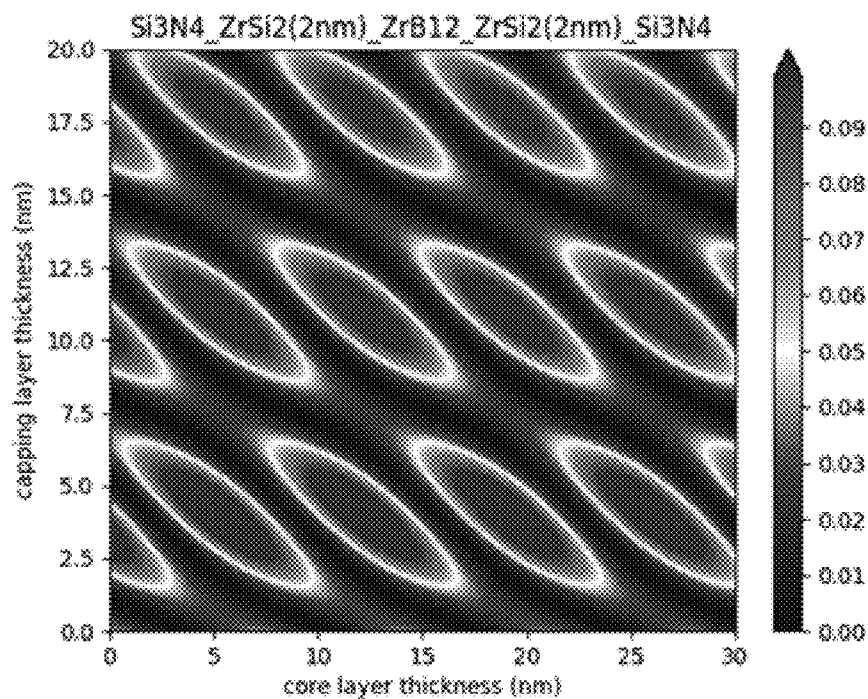
Figure 6A:
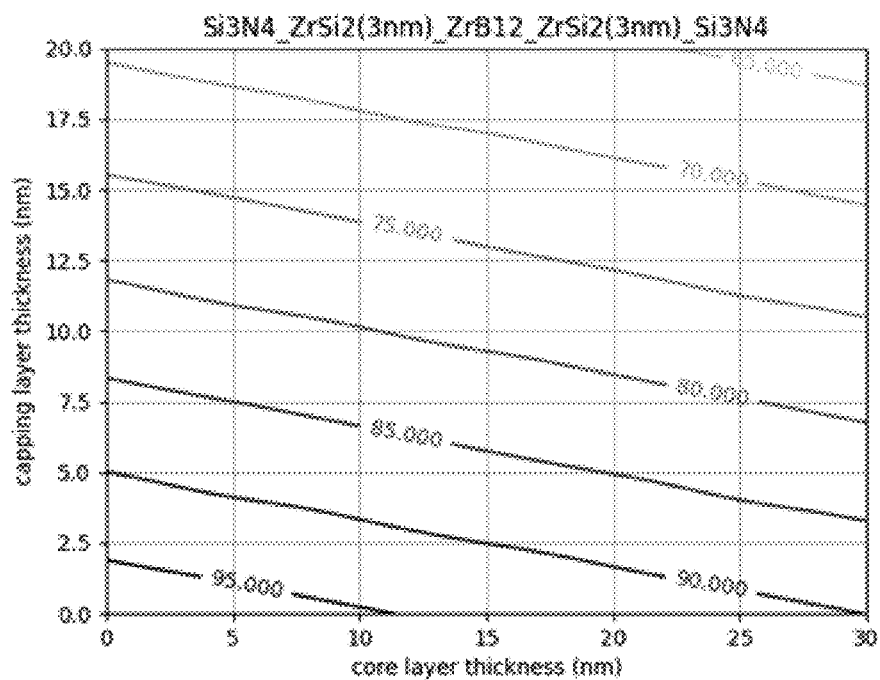
Figure 6B:
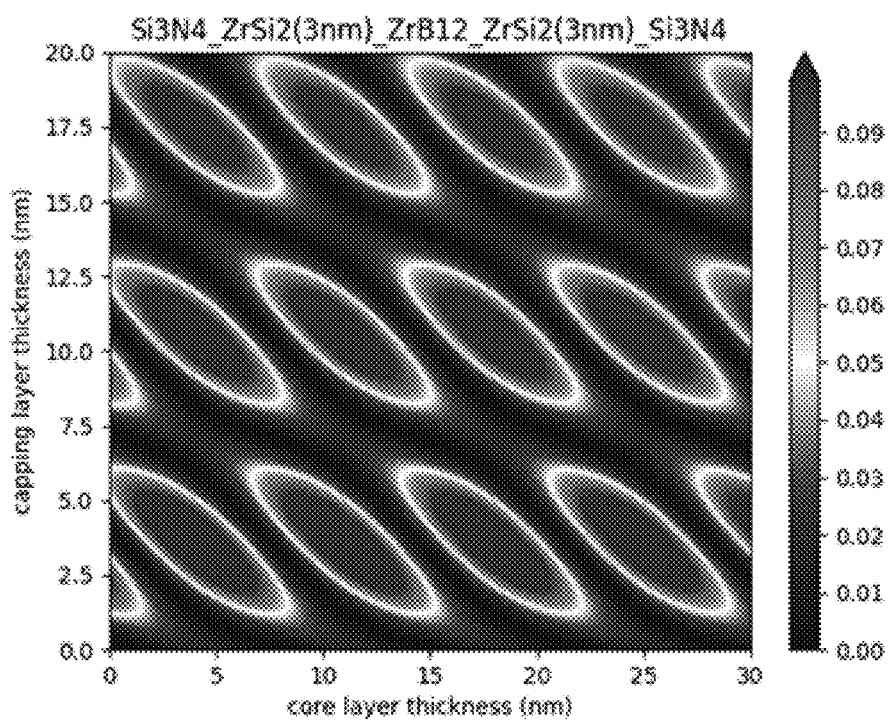

In a state where the thicknesses of the first and second buffer layers were fixed to 0 nm in FIGS. 3A and 3B, 1 nm in FIGS. 4A and 4B, 2 nm in FIGS. 5A and 5B, and 3 nm in FIGS. 6A and 6B, the simulation were performed while changing the thickness of the core layer and the thickness of the first and second capping layers.

The pellicle according to the first embodiment may be represented by $Si_3N_4\_ZrSi_2\_ZrB_{12}\_ZrSi_2\_Si_3N_4$.

[First instance in first embodiment] The pellicle shown in FIGS. 3A and 3B is represented by $Si_3N_4\_ZrSi_2(0\ nm)\_ZrB_{12}\_ZrSi_2(0\ nm)\_Si_3N_4$.

[Second instance in first embodiment] The pellicle shown in FIGS. 4A and 4B is represented by $Si_3N_4\_ZrSi_2(1\ nm)\_ZrB_{12}\_ZrSi_2(1\ nm)\_Si_3N_4$.

[Third instance in first embodiment] The pellicle shown in FIGS. 5A and 5B is represented by $Si_3N_4\_ZrSi_2(2\ nm)\_ZrB_{12}\_ZrSi_2(2\ nm)\_Si_3N_4$.

[Fourth instance in first embodiment] The pellicle shown in FIGS. 6A and 6B is represented by $Si_3N_4\_ZrSi_2(3\ nm)\_ZrB_{12}\_ZrSi_2(3\ nm)\_Si_3N_4$.

It can be seen that the pellicle according to the first instance in the first embodiment exhibits a transmittance of 90% or more regardless of the thickness of the core layer when the thickness of the capping layer is about 6 nm or less.

It can be seen that the pellicle according to the second instance in the first embodiment exhibits a transmittance of 90% or more regardless of the thickness of the core layer when the thickness of the capping layer is 5.7 nm or less.

It can be seen that the pellicle according to the third instance in the first embodiment exhibits a transmittance of 90% or more regardless of the thickness of the core layer when the thickness of the capping layer is 5.4 nm or less.

It can be seen that the pellicle according to the fourth instance in the first embodiment exhibits a transmittance of 90% or more regardless of the thickness of the core layer when the thickness of the capping layer is 5 nm or less.

In addition, the reflectance of the pellicle according to the first embodiment can be controlled by adjusting the thicknesses of the core layer and the capping layer in consideration of transmittance of 90% or more. That is, the pellicle according to the first embodiment may have a transmittance of 90% or more and a reflectance of 0.06% or less.

FIGS. 7A to 10B are graphs showing transmittance and reflectance of extreme ultraviolet lithography pellicles including a buffer layer of $ZrB_x$ ($x=12$) according to a second embodiment of the present disclosure.

Referring to FIGS. 7A to 10B, the pellicle according to the second embodiment includes a core layer of B, first and second buffer layers of $ZrB_x$ ($x=12$), and first and second capping layers of $ZrSi_2$. While changing the thickness of the core layer to 0 to 30 nm, the thickness of the first and second buffer layers to 0 to 3 nm, and the thickness of the first and second capping layers to 0 to 20 nm, respectively, transmittance and reflectance in an extreme ultraviolet output environment of 350 W were simulated for the pellicle according to the second embodiment.

Figure 7A:
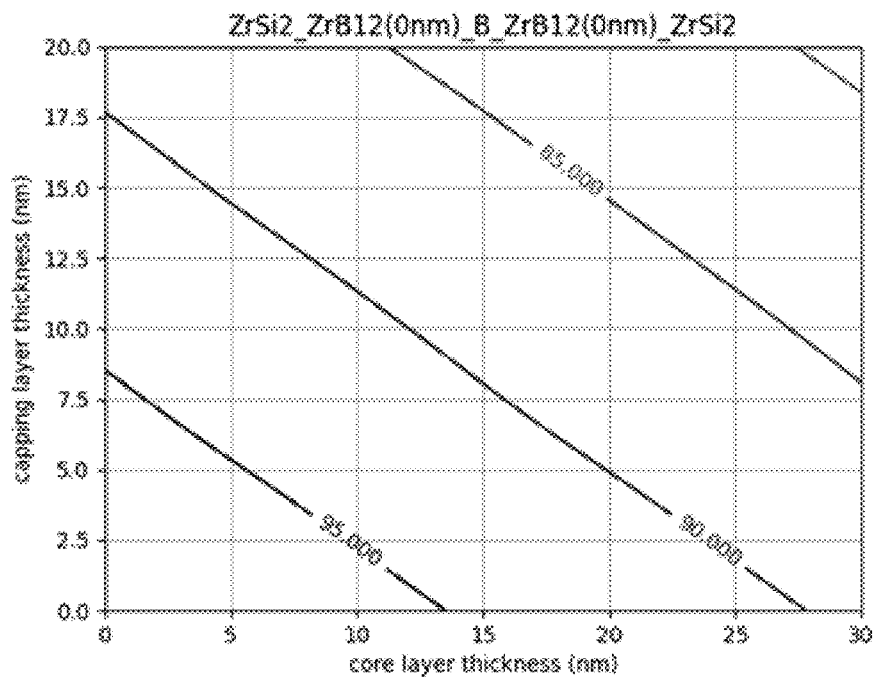
FIGS. 7A, 7B, 8A, 8B, 9A, 9B, 10A, and 10B are graphs showing transmittance and reflectance of extreme ultraviolet lithography pellicles including a buffer layer of $ZrB_x$ (x=12) according to a second embodiment of the present disclosure.
Figure 7B:
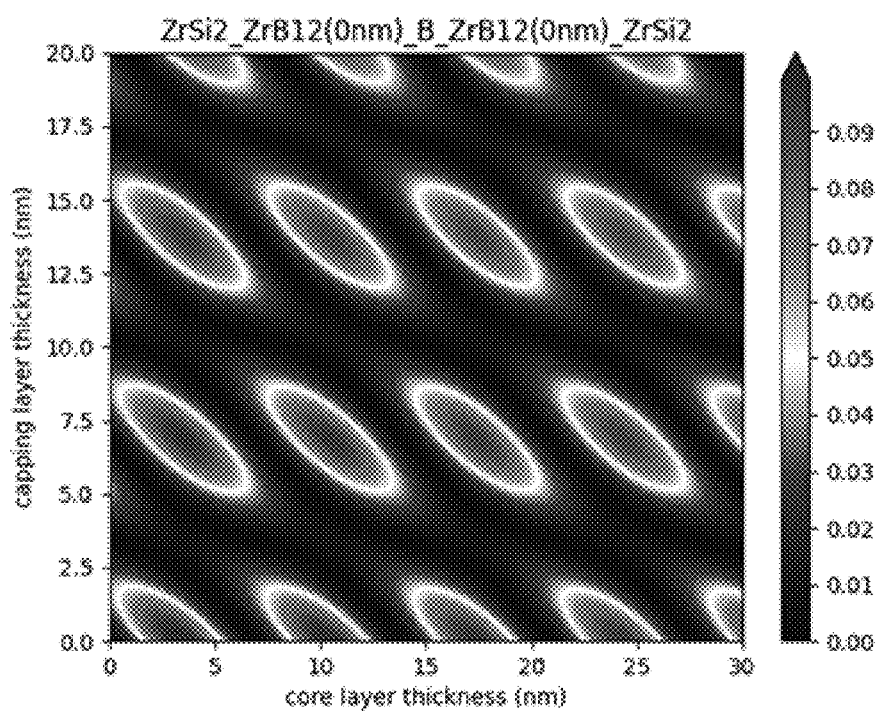
Figure 8A:
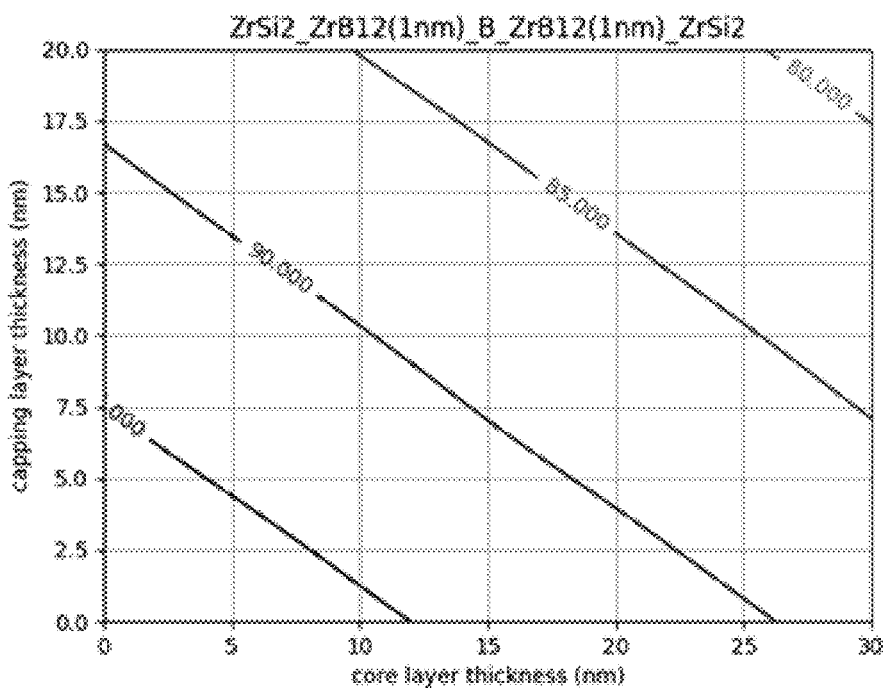
Figure 8B:
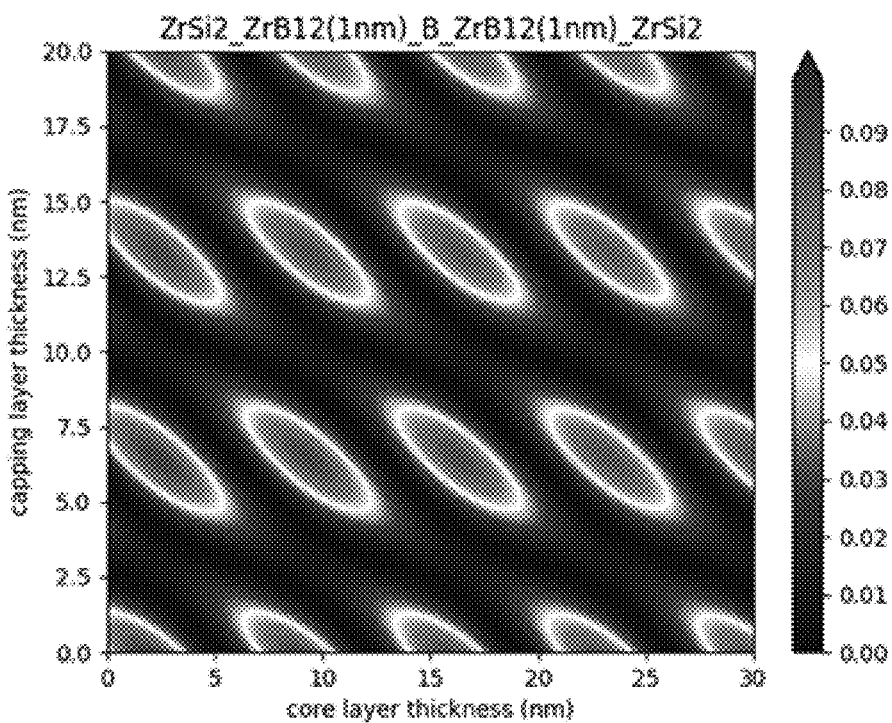
Figure 9A:
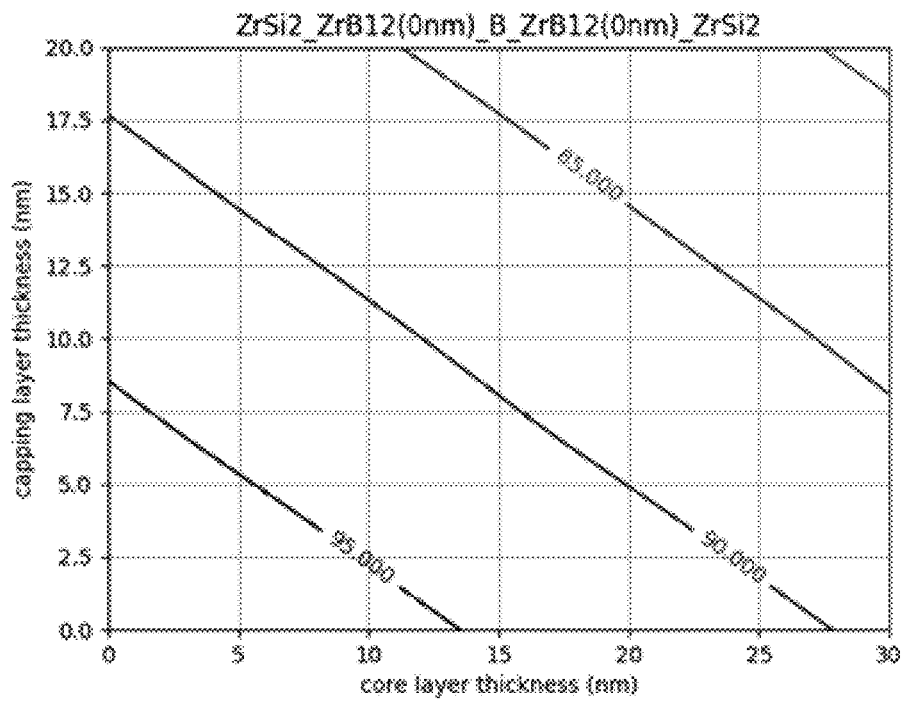
Figure 9B:
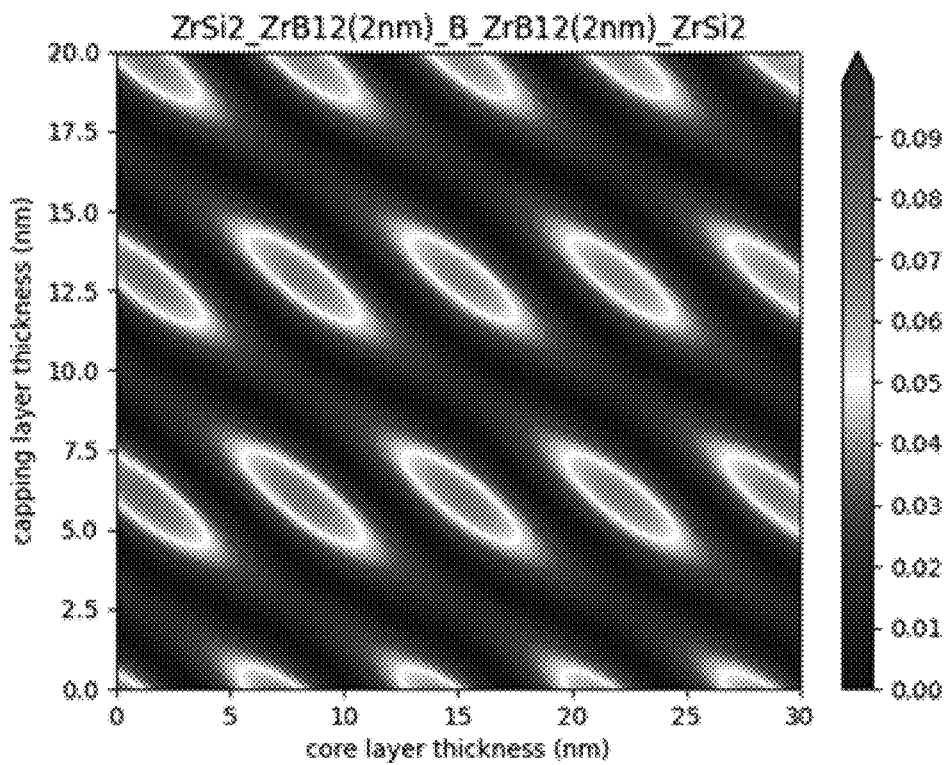
Figure 10A:
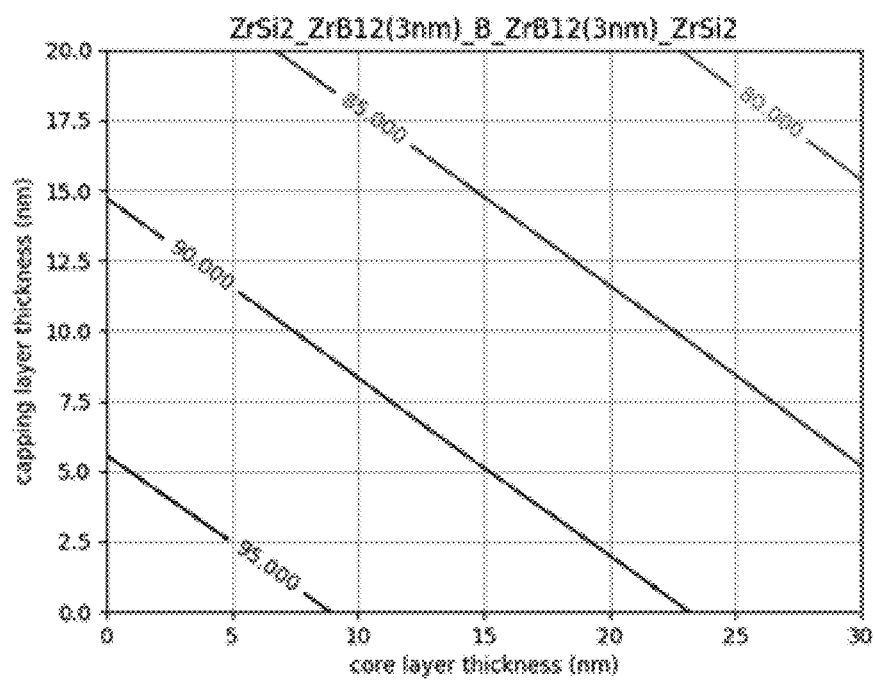
Figure 10B:
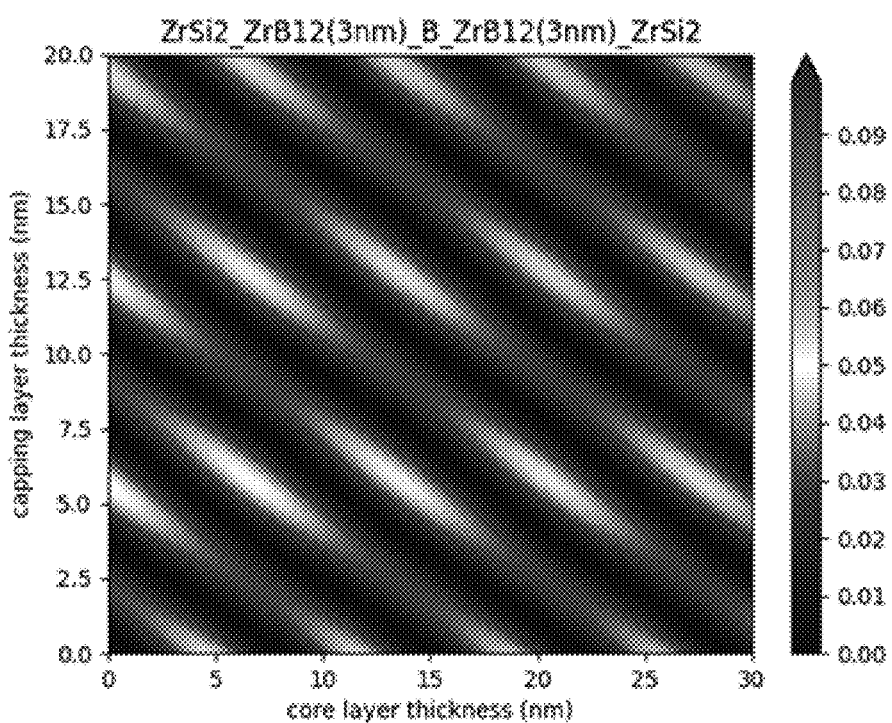

In a state where the thicknesses of the first and second buffer layers were fixed to 0 nm in FIGS. 7A and 7B, 1 nm in FIGS. 8A and 8B, 2 nm in FIGS. 9A and 9B, and 3 nm in FIGS. 10A and 10B, the simulation were performed while changing the thickness of the core layer and the thickness of the first and second capping layers.

The pellicle according to the second embodiment may be represented by $ZrSi_2\_ZrB_{12}\_B\_ZrB_{12}\_ZrSi_2$.

[First instance in second embodiment] The pellicle shown in FIGS. 7A and 7B is represented by $ZrSi_2\_ZrB_{12}(0\ nm)\_B\_ZrB_{12}(0\ nm)\_ZrSi_2$.

[Second instance in second embodiment] The pellicle shown in FIGS. 8A and 8B is represented by $ZrSi_2\_ZrB_{12}(1\ nm)\_B\_ZrB_{12}(1\ nm)\_ZrSi_2$.

[Third instance in second embodiment] The pellicle shown in FIGS. 9A and 9B is represented by $ZrSi_2\_ZrB_{12}(2\ nm)\_B\_ZrB_{12}(2\ nm)\_ZrSi_2$.

[Fourth instance in second embodiment] The pellicle shown in FIGS. 10A and 10B is represented by $ZrSi_2\_ZrB_{12}(3\ nm)\_B\_ZrB_{12}(3\ nm)\_ZrSi_2$.

It can be seen that the pellicle according to the first instance in the second embodiment exhibits a transmittance of 90% or more when the thickness of the capping layer is 17.5 nm or less and the thickness of the core layer is 28 nm or less.

It can be seen that the pellicle according to the second instance in the second embodiment exhibits a transmittance of 90% or more when the thickness of the capping layer is 17 nm or less and the thickness of the core layer is 28 nm or less.

It can be seen that the pellicle according to the third instance in the second embodiment exhibits a transmittance of 90% or more when the thickness of the capping layer is 16 nm or less and the thickness of the core layer is 24 nm or less.

It can be seen that the pellicle according to the fourth instance in the second embodiment exhibits a transmittance of 90% or more when the thickness of the capping layer is 15 nm or less and the thickness of the core layer is 23 nm or less.

In addition, the reflectance of the pellicle according to the second embodiment can be controlled by adjusting the thicknesses of the core layer and the capping layer in consideration of transmittance of 90% or more. That is, the pellicle according to the second embodiment may have a transmittance of 90% or more and a reflectance of 0.06% or less.

FIGS. 11A to 14B are graphs showing transmittance and reflectance of extreme ultraviolet lithography pellicles including a capping layer of $ZrB_x$ ($x=12$) according to a third embodiment of the present disclosure.

Referring to FIGS. 11A to 14B, the pellicle according to the third embodiment includes a core layer of Si, first and second buffer layers of $ZrSi_2$, and first and second capping layers of $ZrB_x$ ($x=12$). While changing the thickness of the core layer to 0 to 30 nm, the thickness of the first and second buffer layers to 0 to 3 nm, and the thickness of the first and second capping layers to 0 to 20 nm, respectively, transmittance and reflectance in an extreme ultraviolet output environment of 350 W were simulated for the pellicle according to the third embodiment.

Figure 11A:
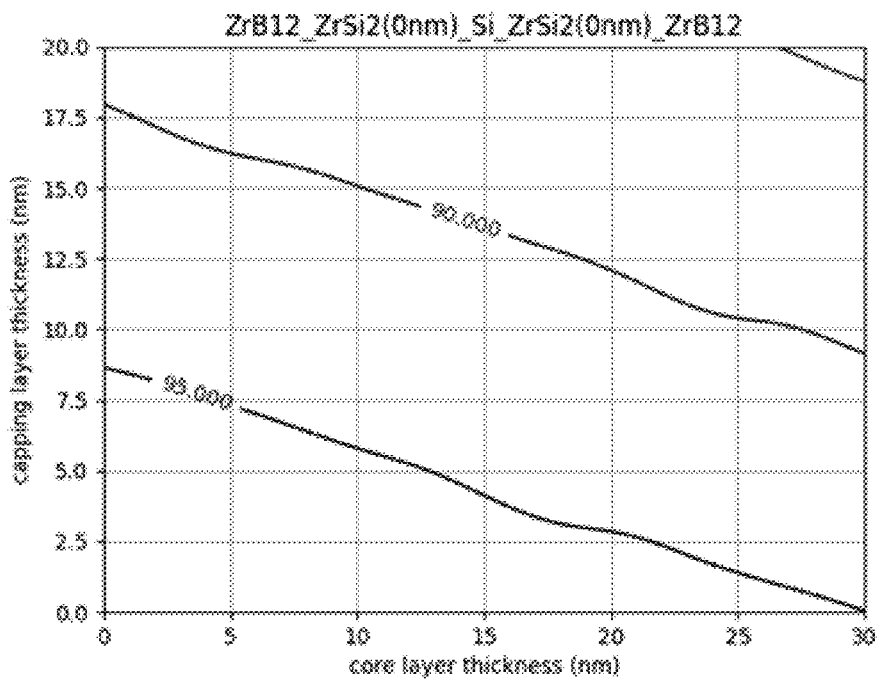
FIGS. 11A, 11B, 12A, 12B, 13A, 13B, 14A, and 14B are graphs showing transmittance and reflectance of extreme ultraviolet lithography pellicles including a capping layer of $ZrB_x$ (x=12) according to a third embodiment of the present disclosure.
Figure 11B:
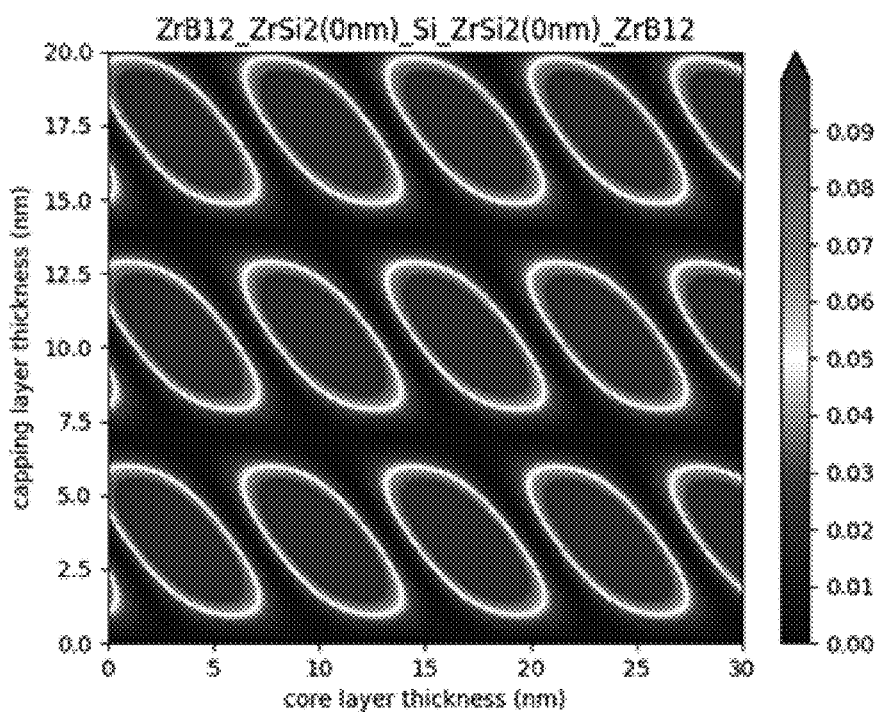
Figure 12A:
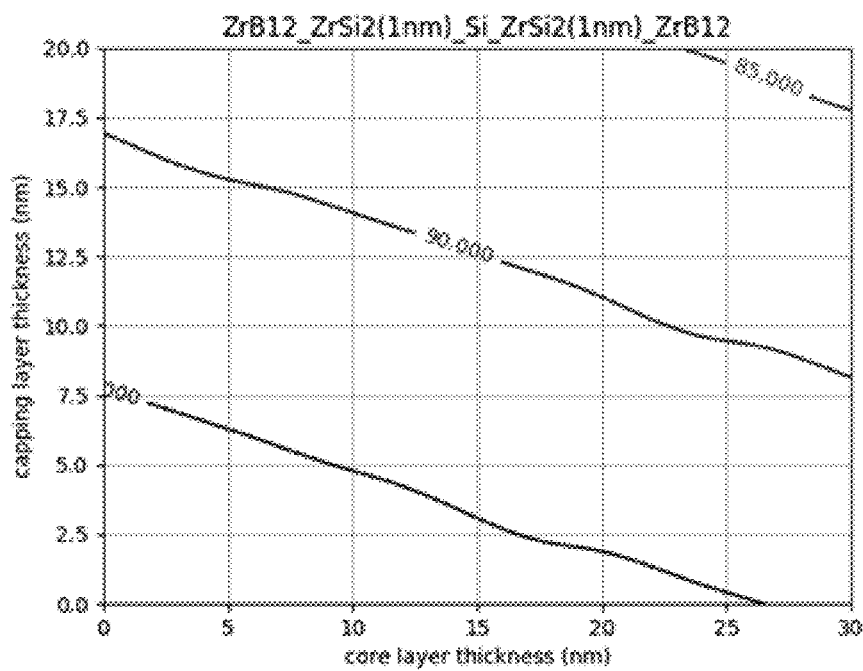
Figure 12B:
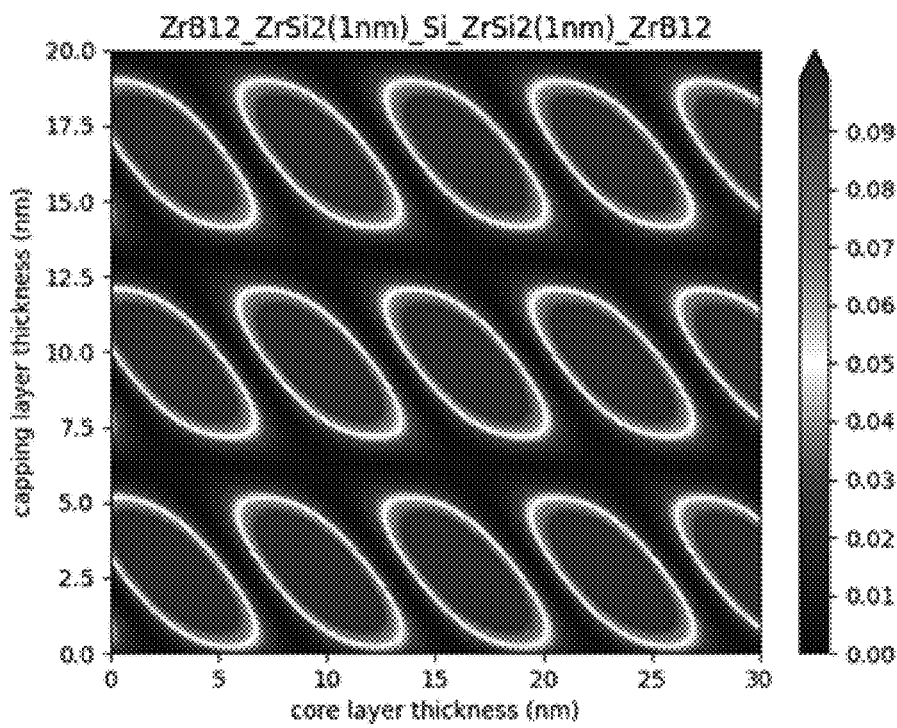
Figure 13A:
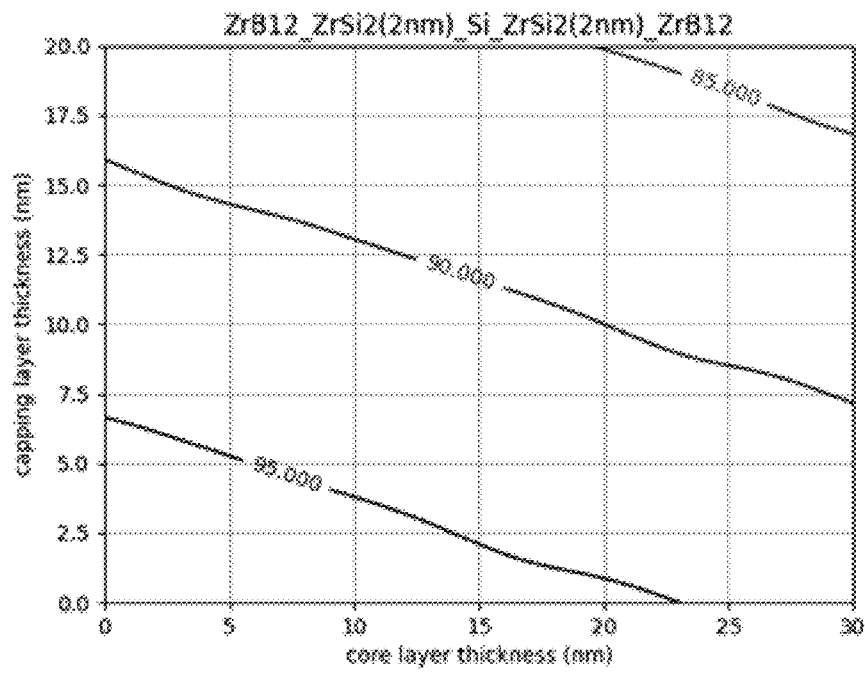
Figure 13B:
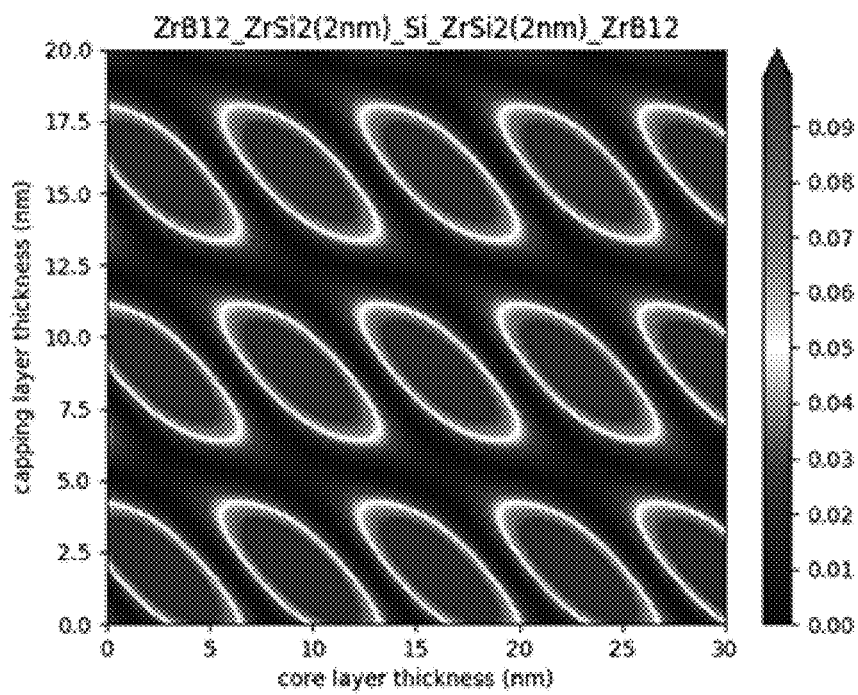
Figure 14A:
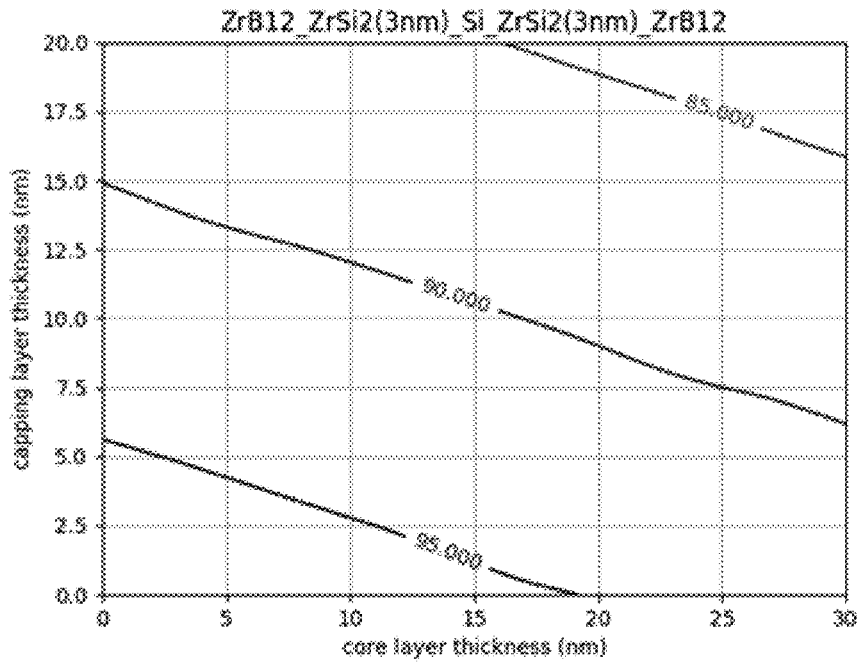
Figure 14B:
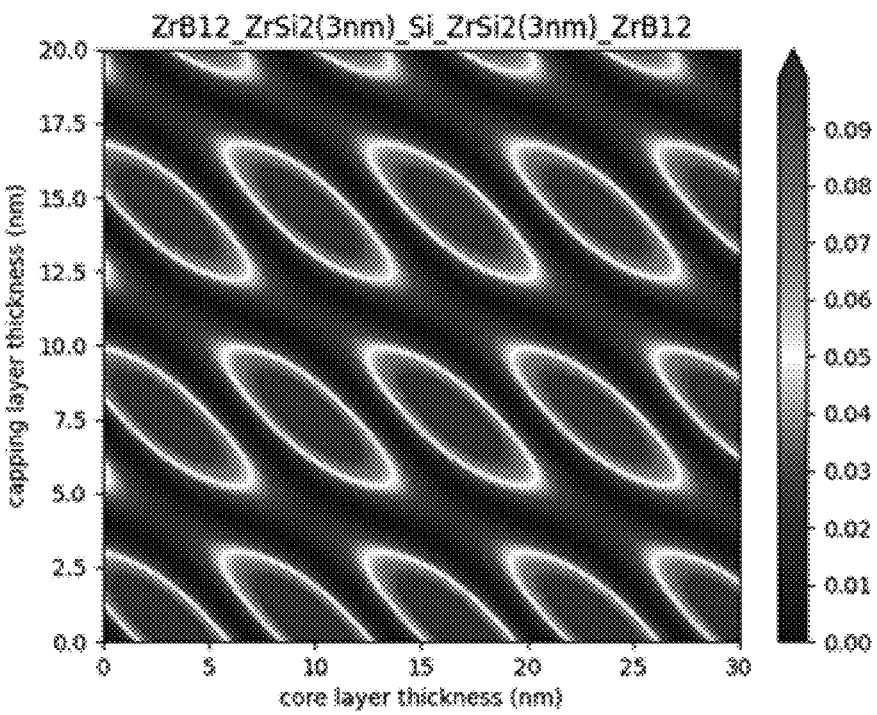

In a state where the thicknesses of the first and second buffer layers were fixed to 0 nm in FIGS. 11A and 11B, 1 nm in FIGS. 12A and 12B, 2 nm in FIGS. 13A and 13B, and 3 nm in FIGS. 14A and 14B, the simulation were performed while changing the thickness of the core layer and the thickness of the first and second capping layers.

The pellicle according to the third embodiment may be represented by $ZrB_{12}\_ZrSi_2\_Si\_ZrSi_2\_ZrB_{12}$.

[First instance in third embodiment] The pellicle shown in FIGS. 11A and 11B is represented by $ZrB_{12}\_ZrSi_2(0\ nm)\_Si\_ZrSi_2(0\ nm)\_ZrB_{12}$.

[Second instance in third embodiment] The pellicle shown in FIGS. 12A and 12B is represented by $ZrB_{12}\_ZrSi_2(1\ nm)\_Si\_ZrSi_2(1\ nm)\_ZrB_{12}$.

[Third instance in third embodiment] The pellicle shown in FIGS. 13A and 13B is represented by $ZrB_{12}\_ZrSi_2(2\ nm)\_Si\_ZrSi_2(2\ nm)\_ZrB_{12}$.

[Fourth instance in third embodiment] The pellicle shown in FIGS. 14A and 14B is represented by $ZrB_{12}\_ZrSi_2(3\ nm)\_Si\_ZrSi_2(3\ nm)\_ZrB_{12}$.

It can be seen that the pellicle according to the first instance in the third embodiment exhibits a transmittance of 90% or more regardless of the thickness of the core layer when the thickness of the capping layer is 18 nm or less.

It can be seen that the pellicle according to the second instance in the third embodiment exhibits a transmittance of 90% or more regardless of the thickness of the core layer when the thickness of the capping layer is 17 nm or less.

It can be seen that the pellicle according to the third instance in the third embodiment exhibits a transmittance of 90% or more regardless of the thickness of the core layer when the thickness of the capping layer is 16 nm or less.

It can be seen that the pellicle according to the fourth instance in the third embodiment exhibits a transmittance of 90% or more regardless of the thickness of the core layer when the thickness of the capping layer is 15 nm or less.

In addition, the reflectance of the pellicle according to the third embodiment can be controlled by adjusting the thicknesses of the core layer and the capping layer in consideration of transmittance of 90% or more. That is, the pellicle according to the third embodiment may have a transmittance of 90% or more and a reflectance of 0.06% or less.

As described above, according to the present disclosure, the pellicle for extreme ultraviolet lithography can provide a high transmittance of 90% or more because at least one of the core layer, the buffer layer, and the capping layer constituting the pellicle layer contains $ZrB_x$ ($2<x<16$).

In addition, the pellicle for extreme ultraviolet lithography according to the present disclosure can provide thermal stability, mechanical stability, and chemical durability while having a high transmittance of 90% or more.

While the present disclosure has been particularly shown and described with reference to an exemplary embodiment thereof, it will be understood by those skilled in the art that various changes in form and details may be made therein without departing from the scope of the present disclosure as defined by the appended claims.

What is claimed is:

1. A pellicle for extreme ultraviolet lithography having an extreme ultraviolet transmittance of 90% or more, the pellicle comprising:
    a support layer having an opening formed in a central portion thereof; and
    a pellicle layer including a core layer formed of $ZrB_x$ ($2<x<16$) on the support layer to cover the opening.

2. The pellicle of claim 1, wherein the support layer is a silicon substrate.

3. The pellicle of claim 1, wherein the pellicle layer includes:
    a core layer; and
    a capping layer formed on both surfaces of the core layer.

4. The pellicle of claim 3, wherein the capping layer includes B, C, Zr, $SiO_x$, $SiN_x$, $ZrO_x$, $ZrSi_x$ ($x\leq2$), $ZrC_x$ ($0.8\leq x\leq1.2$), $ZrB_x$ ($2<x<16$), $ZrB_xSi_y$ ($x\geq2$, $y\geq2$), $ZrC_xB_y$ ($0.8\leq x\leq1.2$, $y\geq2$), or $ZrC_xSi_y$ ($0.8\leq x\leq1.2$, $y\leq2$).

5. The pellicle of claim 3, wherein the pellicle layer has a thickness of 40 nm or less and the capping layer has a maximum thickness of 10 nm.

6. The pellicle of claim 1, wherein the pellicle layer includes:
    the core layer having a first surface and a second surface opposite to the first surface;
    a first buffer layer formed on the first surface;
    a second buffer layer formed on the second surface;
    a first capping layer formed on the first buffer layer; and
    a second capping layer formed on the second buffer layer.

7. The pellicle of claim 6, wherein at least one of the first buffer layer, the second buffer layer, the first capping layer, or the second capping layer includes the $ZrB_x$ ($2<x<16$).

8. The pellicle of claim 6, wherein each of the first and second buffer layers includes B, C, Zr, $ZrSi_x$ ($x\leq2$), $ZrC_x$ ($0.8\leq x\leq1.2$), $ZrB_x$ ($2<x<16$), $ZrB_xSi_y$ ($x\geq2$, $y\geq2$), $ZrC_xB_y$ ($0.8\leq x\leq1.2$, $y\geq2$), or $ZrC_xSi$ ($0.8\leq x\leq1.2$, $y\leq2$).

9. The pellicle of claim 6, wherein each of the first and second capping layers includes B, C, Zr, $SiO_x$, $SiN_x$, $ZrO_x$, $ZrSi_x$ ($x\leq2$), $ZrC_x$ ($0.8\leq x\leq1.2$), $ZrB_x$ ($2<x<16$), $ZrB_xSi_y$ ($x\geq2$, $y\geq2$), $ZrC_xB_y$ ($0.8\leq x\leq1.2$, $y\geq2$), or $ZrC_xSi_y$ ($0.8\leq x\leq1.2$, $y\leq2$).

10. The pellicle of claim 6, wherein the pellicle layer has a thickness of 40 nm or less, wherein each of the first and second buffer layers has a thickness of 3 nm or less, and wherein each of the first and second capping layers has a thickness of 5 nm or less.

11. A pellicle for extreme ultraviolet lithography having an extreme ultraviolet transmittance of 90% or more, the pellicle comprising:
    a support layer having an opening formed in a central portion thereof; and
    a pellicle layer formed on the support layer to cover the opening, and including $ZrB_x$ ($2<x<16$) or including a ternary system or more material selected from Zr, B, Si, and Mo,
    wherein the pellicle layer includes:
    a core layer formed of the $ZrB_x$ ($2<x<16$); and
    a capping layer formed on both surfaces of the core layer.

12. The pellicle of claim 11, wherein the capping layer includes the $ZrB_x$ ($2<x<16$) or includes the ternary system or more material selected from Zr, B, Si, and Mo.

13. The pellicle of claim 11, wherein the pellicle layer includes:
    the core layer having a first surface and a second surface opposite to the first surface;
    a first buffer layer formed on the first surface;
    a second buffer layer formed on the second surface;
    a first capping layer formed on the first buffer layer; and
    a second capping layer formed on the second buffer layer, and
    wherein at least one of the first buffer layer, the second buffer layer, the first capping layer, or the second capping layer includes the $ZrB_x$ ($2<x<16$) or includes the ternary system or more material selected from Zr, B, Si, and Mo.

* * * * *